(12) United States Patent
Wen

(10) Patent No.: US 11,196,387 B2
(45) Date of Patent: Dec. 7, 2021

(54) AMPLIFIER CIRCUIT WITH HIGH-ORDER DAMPING CIRCUIT AND THE HIGH-ORDER DAMPING CIRCUIT

(71) Applicant: MEDIATEK INC., Hsinchu (TW)

(72) Inventor: Sung-Han Wen, Hsinchu (TW)

(73) Assignee: MEDIATEK INC., Hsinchu (TW)

( * ) Notice: Subject to any disclaimer, the term of this patent is extended or adjusted under 35 U.S.C. 154(b) by 0 days.

(21) Appl. No.: 16/849,384

(22) Filed: Apr. 15, 2020

(65) Prior Publication Data
US 2020/0382072 A1   Dec. 3, 2020

Related U.S. Application Data

(60) Provisional application No. 62/853,264, filed on May 28, 2019.

(51) Int. Cl.
| H03F 3/04 | (2006.01) |
| H03F 1/22 | (2006.01) |
| G05F 1/56 | (2006.01) |
| H03F 3/45 | (2006.01) |
| H03H 11/04 | (2006.01) |
| H03H 11/12 | (2006.01) |

(52) U.S. Cl.
CPC ............. *H03F 1/22* (2013.01); *G05F 1/561* (2013.01); *H03F 3/45237* (2013.01);
(Continued)

(58) Field of Classification Search
CPC .. H03F 1/22; H03F 3/45237; H03F 2200/168; H03F 2200/171; H03F 2200/408; H03F 2200/54; H03F 2200/165; H03F 2200/03; H03F 2200/153; H03F 3/301; H03F 3/45183; H03F 3/185; H03F 3/68; H03F 1/0205; H03F 1/56; H03F 3/19; H03F 2200/451; H03F 1/26; H03F 1/223;
(Continued)

(56) References Cited

U.S. PATENT DOCUMENTS

| 6,208,206 B1 * | 3/2001 | Leung | ................. H03F 1/086 330/100 |
| 7,495,422 B2 * | 2/2009 | Mok | ................. G05F 1/575 323/280 |

(Continued)

FOREIGN PATENT DOCUMENTS

| CN | 109309481 A | 2/2019 |
| CN | 109462376 A | 3/2019 |

OTHER PUBLICATIONS

European Search Report dated Oct. 6, 2020, issued in application No. EP 20173876.2.
(Continued)

*Primary Examiner* — Khanh V Nguyen
(74) *Attorney, Agent, or Firm* — McClure, Qualey & Rodack, LLP

(57) ABSTRACT

An amplifier circuit with in-band gain degradation compensation is shown. The amplifier circuit has an input-stage amplifier, at least one intermediate-stage amplifier, and an output-stage amplifier cascaded between an input port and an output port of the amplifier circuit. A compensation capacitor is coupled between the output port of the amplifier circuit and an output port of the input-stage amplifier. A high-order damping circuit is coupled to an output port of the intermediate-stage amplifier.

16 Claims, 10 Drawing Sheets

(52) U.S. Cl.
CPC ..... *H03H 11/0461* (2013.01); *H03H 11/1204* (2013.01); *H03H 11/1291* (2013.01); *H03F 2200/168* (2013.01); *H03F 2200/171* (2013.01); *H03F 2200/408* (2013.01); *H03F 2200/54* (2013.01)

(58) Field of Classification Search
CPC .... H03F 2200/36; H03F 1/08; H03F 3/45475; H03F 3/02; H03F 1/50; G05F 1/561; H03H 11/0461; H03H 11/1204; H03H 11/1291
USPC ............ 330/98, 133, 150, 310, 311
See application file for complete search history.

(56) References Cited

U.S. PATENT DOCUMENTS

| | | | |
|---|---|---|---|
| 7,973,605 B2* | 7/2011 | Dasgupta | H03F 3/45192 330/292 |
| 8,847,678 B2* | 9/2014 | Chen | G05F 1/575 330/107 |
| 10,469,037 B2* | 11/2019 | Wen | H03F 1/14 |
| 2018/0309416 A1 | 10/2018 | Wen et al. | |

OTHER PUBLICATIONS

Chinese language office action dated Nov. 27, 2020, issued in application No. TW 109117301.

Dhanasekaran, V., et al.; "Design of Three-Stage Class-AB 16Ohm Headphone Driver Capable of Handling Wide Range of Load Capacitance;" IEEE Journal of Solid-State Circuits; vol. 44; No. 6; Jun. 2009; pp. 1734-1744.

Mehta, N., et al.; "A 1-mW Class-AB Amplifier With −101 dB THD+N for High-Fidelity 16Ohm Headphones in 65-nm CMOS;" IEEE Journal of Solid-State Circuits; vol. 54; No. 4; Apr. 2009; pp. 948-958.

Wen, S.H., et al.; "A −105dBc THD+N (−114dBc HD2) at 2.8V PP Swing and 120dB DR Audio Decoder with Sample-and-Hold Noise Filtering and Poly Resistor Linearization Schemes;" ISSCC 2019; Session 18; Analog Techniques; Feb. 2009; pp. 293-296.

* cited by examiner

AMPLIFIER CIRCUIT WITH HIGH-ORDER DAMPING CIRCUIT AND THE HIGH-ORDER DAMPING CIRCUIT

CROSS REFERENCE TO RELATED APPLICATIONS

This Application claims the benefit of U.S. Provisional Application No. 62/853,264, filed on May, 28, 2019, the entirety of which is incorporated by reference herein.

BACKGROUND OF THE INVENTION

Field of the Invention

The present invention relates to an amplifier design, and more particularly, to a multi-stage amplifier.

Description of the Related Art

The performance obtainable from a single-stage amplifier is often insufficient for many applications. Therefore, a multi-stage amplifier may be used to achieve the desired performance by cascading several amplifier stages. In a three-stage amplifier, for example, the output of the first-stage amplifier is used as the input for the second-stage amplifier, and the output of the second-stage amplifier is used as the input for the third-stage amplifier.

The stability of a multi-stage amplifier depends on the relative relationship between each non-dominant pole and the unity-gain frequency of the multi-stage amplifier. The non-dominant poles should be at frequencies that are higher than the unity-gain frequency, and thereby the open-loop gain of the multi-stage amplifier is less than one (i.e., 0 dB) at each of the high-frequency non-dominant poles. In this way, the multi-stage amplifier is stable in a closed-loop operation. To address the stability issue, some solutions have been proposed to move the non-dominant poles to the higher frequencies. However, these solutions may result in in-band gain degradation.

There is therefore a need for an innovative frequency compensation design that is capable of enhancing the stability of a multi-stage amplifier without degrading the in-band gain of the multi-stage amplifier.

BRIEF SUMMARY OF THE INVENTION

One of the objectives of the claimed invention is to provide a multi-stage amplifier with a high-order damping circuit.

An amplifier circuit in accordance with an exemplary embodiment of the present invention has an input-stage amplifier, at least one intermediate-stage amplifier, and an output-stage amplifier cascaded between an input port and an output port of the amplifier circuit, a compensation capacitor coupled between the output port of the amplifier circuit and an output port of the input-stage amplifier, and a first high-order damping circuit, coupled to an output port of the intermediate-stage amplifier.

In an exemplary embodiment, the amplifier circuit further has a second high-order damping circuit coupled to an output port of the input-stage amplifier.

A high-order damping circuit in accordance with an exemplary embodiment has a first-stage high-pass filter, a second-stage high-pass filter, and an auxiliary amplifier. The first-stage high-pass filter has an input port coupled to an output port of the input-stage amplifier or an output port of the intermediate-stage amplifier. The second-stage high-pass filter has an input port coupled to an output port of the first-stage high-pass filter. The auxiliary amplifier has an input port coupled to an output port of the second-stage high-pass filter, and an output port coupled to the input port of the first-stage high-pass filter.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
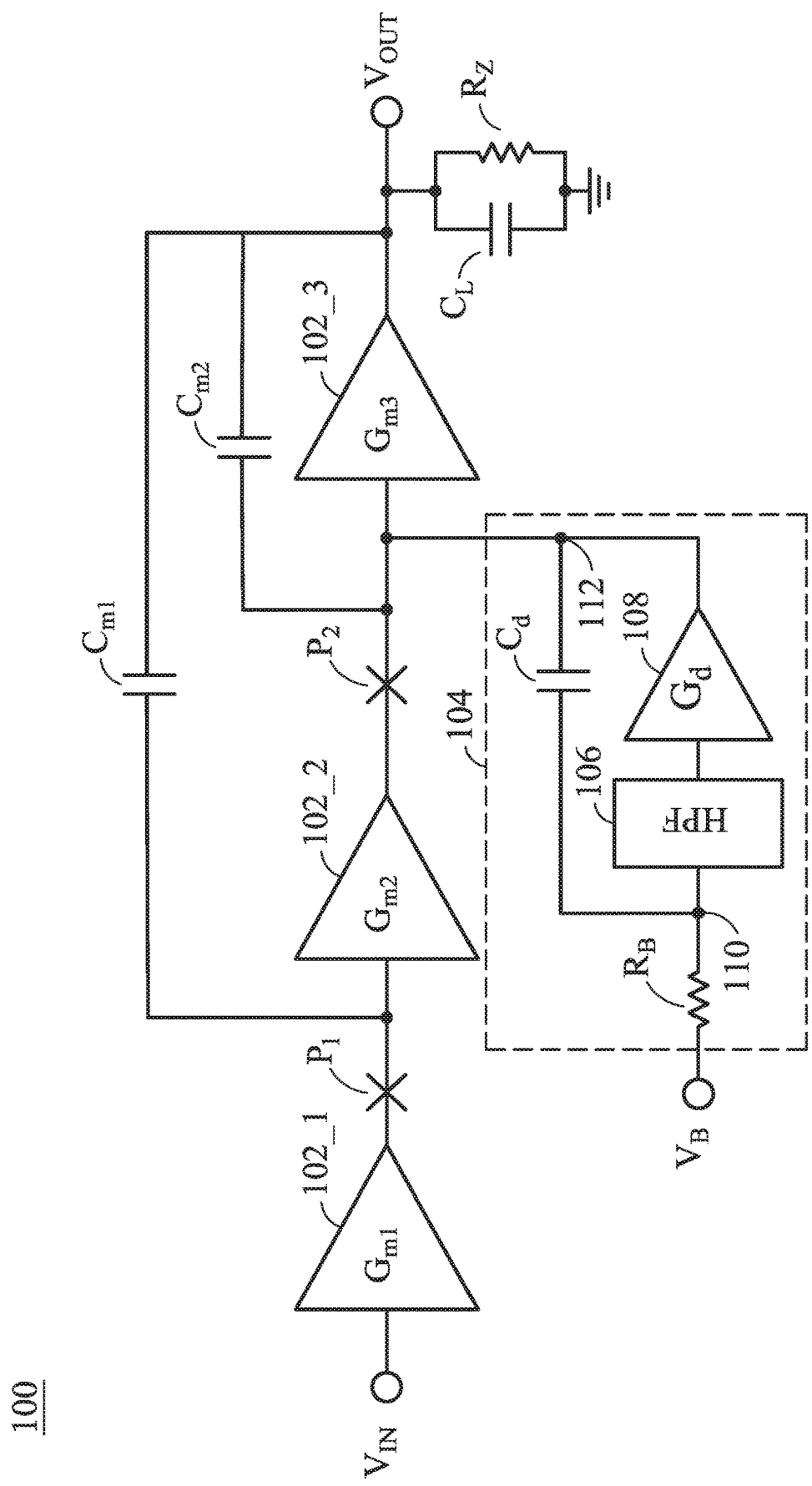
FIG. 1 is a diagram illustrating an amplifier circuit 100 in accordance with an exemplary embodiment of the present invention.

FIG. 1 is a diagram illustrating an amplifier circuit 100 in accordance with an exemplary embodiment of the present invention. By way of example, but not limitation, the amplifier circuit 100 may be used in an audio application. As shown in FIG. 1, the amplifier circuit 100 is a multi-stage amplifier (e.g., a three-stage amplifier including an input-stage amplifier 102_1, at least one intermediate-stage amplifier 102_2, and an output-stage amplifier 102_3 cascaded between an input port (VIN) and an output port (VOUT) of the amplifier circuit 100), a high-order damping circuit 104, and a plurality of compensation capacitors (e.g., Cm1 and Cm2).

The transconductance of the three amplifiers 102_1, 102_2 and 102_3 are denoted by Gm1, Gm2, and Gm3, respectively. The amplifier circuit 100 uses the input-stage amplifier 102_1 to receive an input voltage VIN, and uses the output-stage amplifier 102_3 to output an output voltage VOUT. Each of the compensation capacitors Cm1 and Cm2 is used for Miller compensation. Hence, a nested Miller compensation (NMC) scheme may be implemented using the compensation capacitors Cm1 and Cm2. However, this is for illustrative purposes only, and is not meant to be a limitation of the present invention. In some embodiments of the present invention, the compensation capacitor Cm2 may be optional, depending upon design considerations. The compensation capacitor Cm1 is coupled between an output port (VOUT) of the amplifier circuit 100 and an output port P1 of the input-stage amplifier 102_1. The optional compensation capacitor Cm2 is coupled between the output port (VOUT) of the amplifier circuit 100 and an output port P2 of the intermediate-stage amplifier 102_2.

In this exemplary embodiment, the high-order damping circuit 104 is a compensation design, too. The high-order damping circuit 104 is coupled to the output port P2 of the intermediate-stage amplifier 102_2, and includes a capacitor Cd, a resistor RB, a high-pass filter 106 and an auxiliary amplifier 108 (whose transconductance is Gd). The capacitor Cd is coupled to the resistor RB (having one terminal coupled to a reference voltage source VB/GND) through a connection terminal 110 to form a first-stage high-pass filter that has an input port 112 coupled to the output port P2 of intermediate-stage amplifier 102_2 and an output port (referring to the connection terminal 110) coupled to the input port of the high-pass filter 106. The high-pass filter 106 performing the second-stage of high-pass filtering may be named the second-stage high-pass filter. The auxiliary amplifier 108 has an input port coupled to the output port of the second-stage high-pass filter 106, and an output port coupled to the input port 112 of the first-stage high-pass filter. As shown, the first-stage high-pass filter (Cd and RB), the second-stage high-pass filter 106 and the auxiliary amplifier 108 form a loop. The second-stage high-pass filter 106 may be a first-order high-pass filter (e.g., formed by another pair of resistor and capacitor, RF and CF in the following figures) or a high-order high-pass filter. The damping circuit 104 may be a second-order damping circuit or an N-order damping circuit where N is greater than 2.

The high-order damping circuit 104 introduces a topology called damping-factor-control frequency compensation (DFCFC) for a multi-stage amplifier that significantly increases the bandwidth and improves the transient response.

Figure 2:
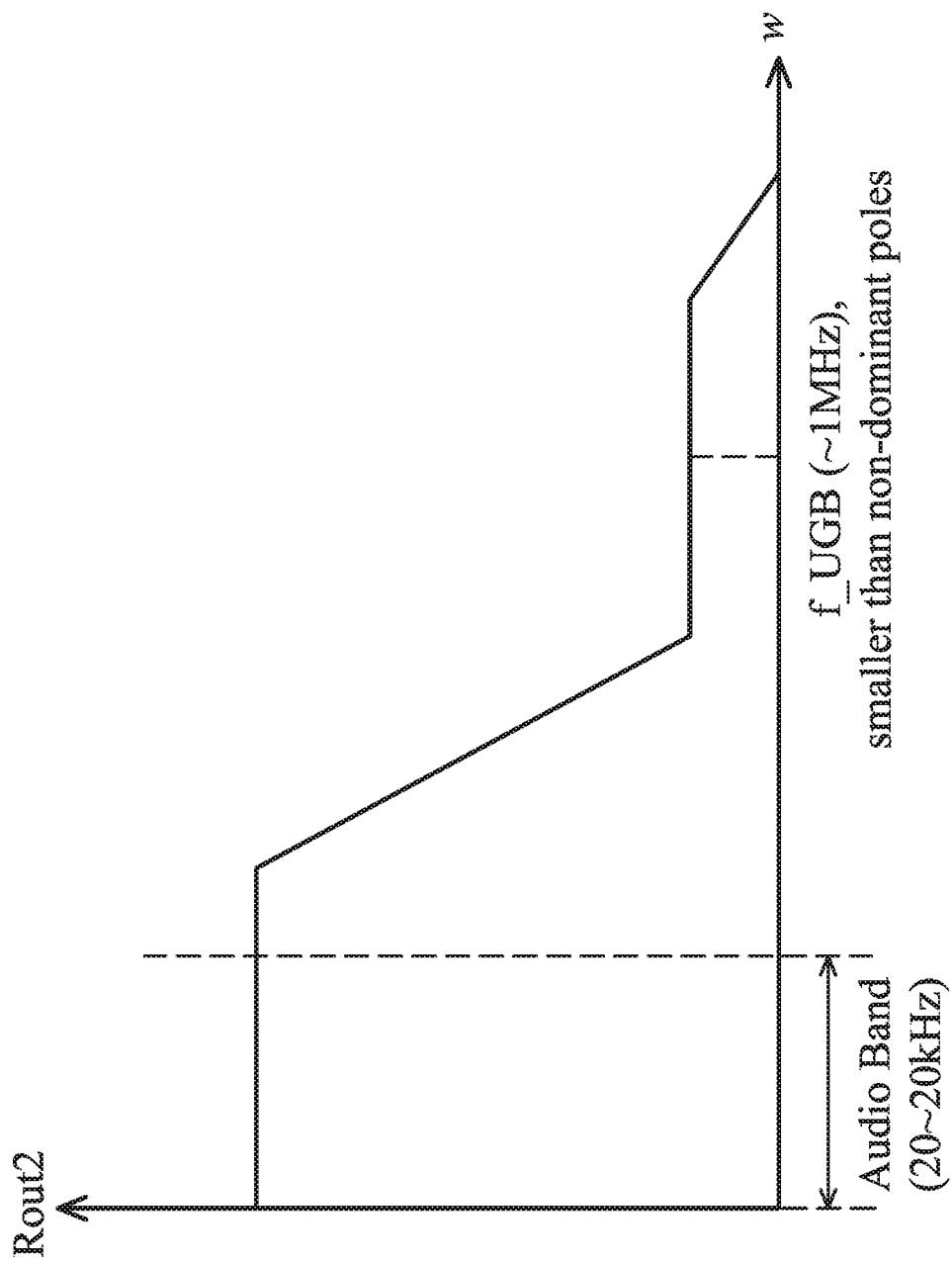
FIG. 2 is a plot of output equivalent resistance Rout2 vs. frequency w, which illustrates the concept of the proposed frequency compensation scheme (implemented by the high-order damping circuit 104) in accordance with an exemplary embodiment of the present invention.

FIG. 2 is a plot of output equivalent resistance Rout2 vs. frequency w, which illustrates the concept of the proposed frequency compensation scheme (implemented by the high-order damping circuit 104) in accordance with an exemplary embodiment of the present invention. The output equivalent resistance Rout2 is the resistance measured by looking back into the intermediate-stage amplifier 102_2. FIG. 2 shows that, with the high-order damping circuit 104, the non-dominant poles are pushed higher than the unity-gain frequency f_UGB (e.g., around 1 MHz) and the stability of the amplifier circuit 100 can be guaranteed, while the output equivalent resistance Rout2 is not required to be decreased within the audio band (e.g., 20~20 KHz) compared with the conventional $1^{st}$-order damping circuit. Thus, the gain of the intermediate-stage amplifier 102_2 is not degraded in the audio band either. The problems of in-band gain degradation are solved. The large gain of the intermediate-stage amplifier 102_2 successfully suppresses crossover distortions of the output stages. The inner loop gain of the amplifier circuit 100 is preserved.

In comparison with a first-order damping circuit, the high-order damping circuit 104 results in a rapid decrease of the output equivalent resistance Rout2 within the expected frequency range. The output equivalent resistance Rout2 is not degraded in the audio band (e.g., 20~20 KHz).

To put it simply, the amplifier circuit 100 with the proposed frequency compensation achieved by the high-order damping circuit 104 can be stable without in-band gain degradation.

There are a variety of implementations of the high-order damping circuit 104.

Figure 3A:
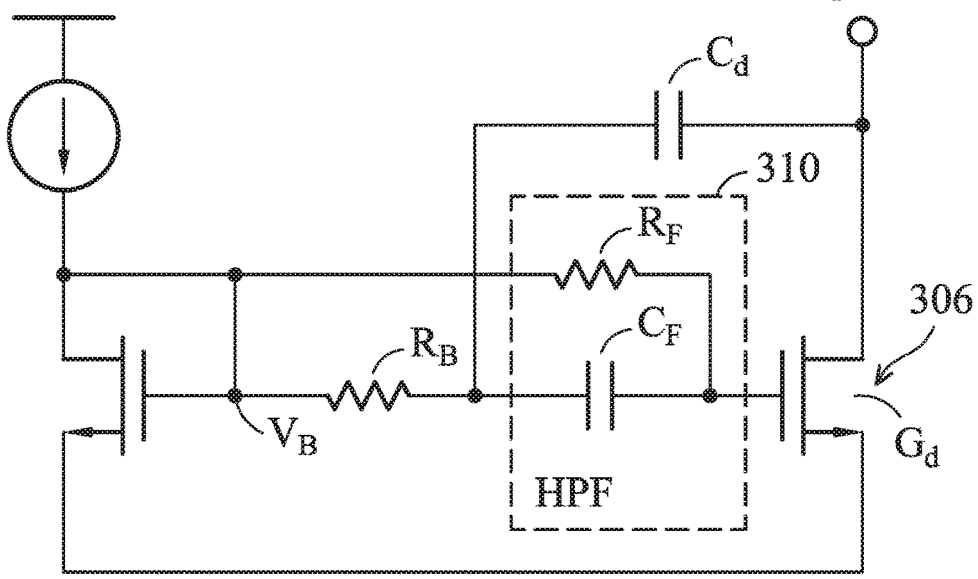
FIG. 3A and FIG. 3B depict two second-order damping circuits 302 and 304 in accordance with exemplary embodiments of the present invention.
Figure 3B:
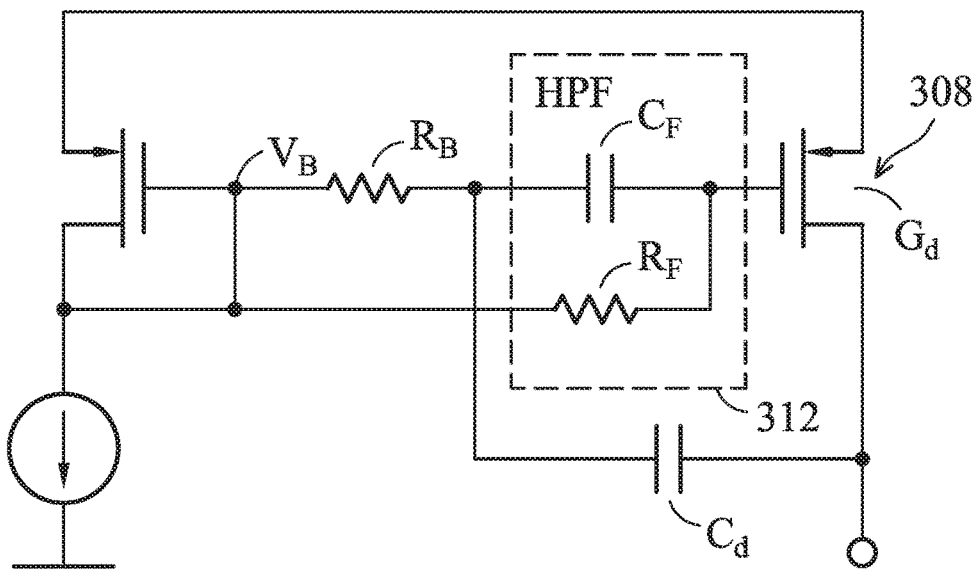

FIG. 3A and FIG. 3B depict two second-order damping circuits 302 and 304 in accordance with exemplary embodiments of the present invention. Based on the current mirror structure, a transistor (e.g., a Metal-Oxide-Semiconductor Field-Effect Transistor, MOSFET) is used to implement the auxiliary amplifier 108 to provide the transconductance Gd. The MOSFET (306/308) has a gate and a drain which are the input port and the output port of the auxiliary amplifier 108, respectively. The second-order damping circuit 302 in FIG. 3A is an NMOS design. The second-order damping circuit 304 in FIG. 3B is a PMOS design. In addition to the resistor-capacitor high-pass filter formed by RB and Cd, the second-stage high pass filter (HPF) 310/312 provides a resistor RF and a capacitor CF to form another resistor-capacitor high-pass filter in the circuit loop. The connection terminal between RB and CD is coupled to the gate of the MOSFET 306/308 through the capacitor CF, and the resistor RF is coupled between the gate of the MOSFET 306/308 and the reference voltage source VB.

Figure 4A:
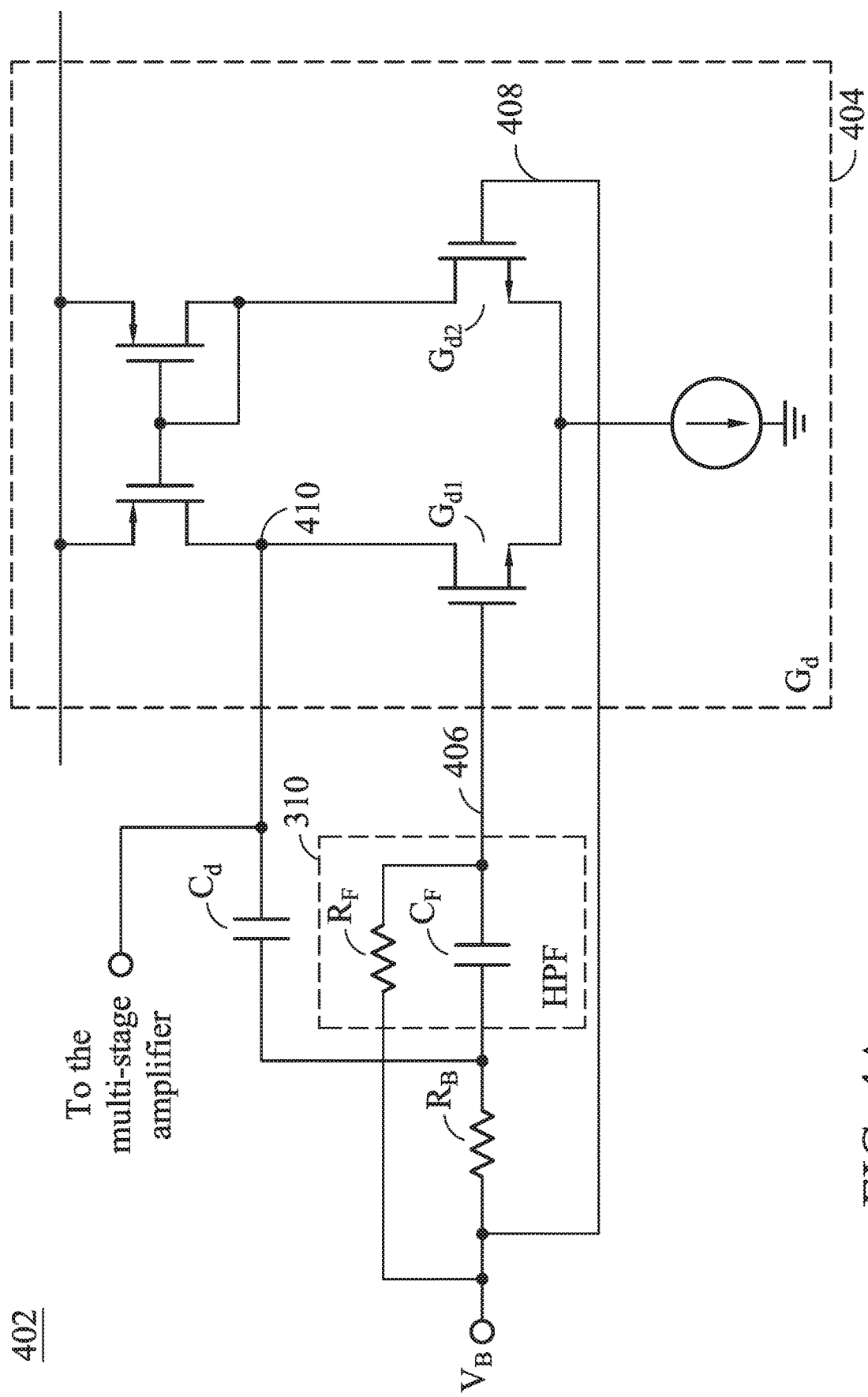
FIG. 4A depicts a second-order damping circuit 402 in accordance with another exemplary embodiment of the present invention, which uses an operational transconductance amplifier (OTA) 404 to implement the auxiliary amplifier 108.

FIG. 4A depicts a second-order damping circuit 402 in accordance with another exemplary embodiment of the present invention, which uses an operational transconductance amplifier (OTA) 404 to implement the auxiliary amplifier 108 whose transconductance is Gd. The OTA 404 has a first differential input terminal 406 which is the input port of the auxiliary amplifier 108, a second differential input terminal 408 coupled to a reference voltage source VB, and an output terminal 410 which is the output port of the auxiliary amplifier 108.

Figure 4B:
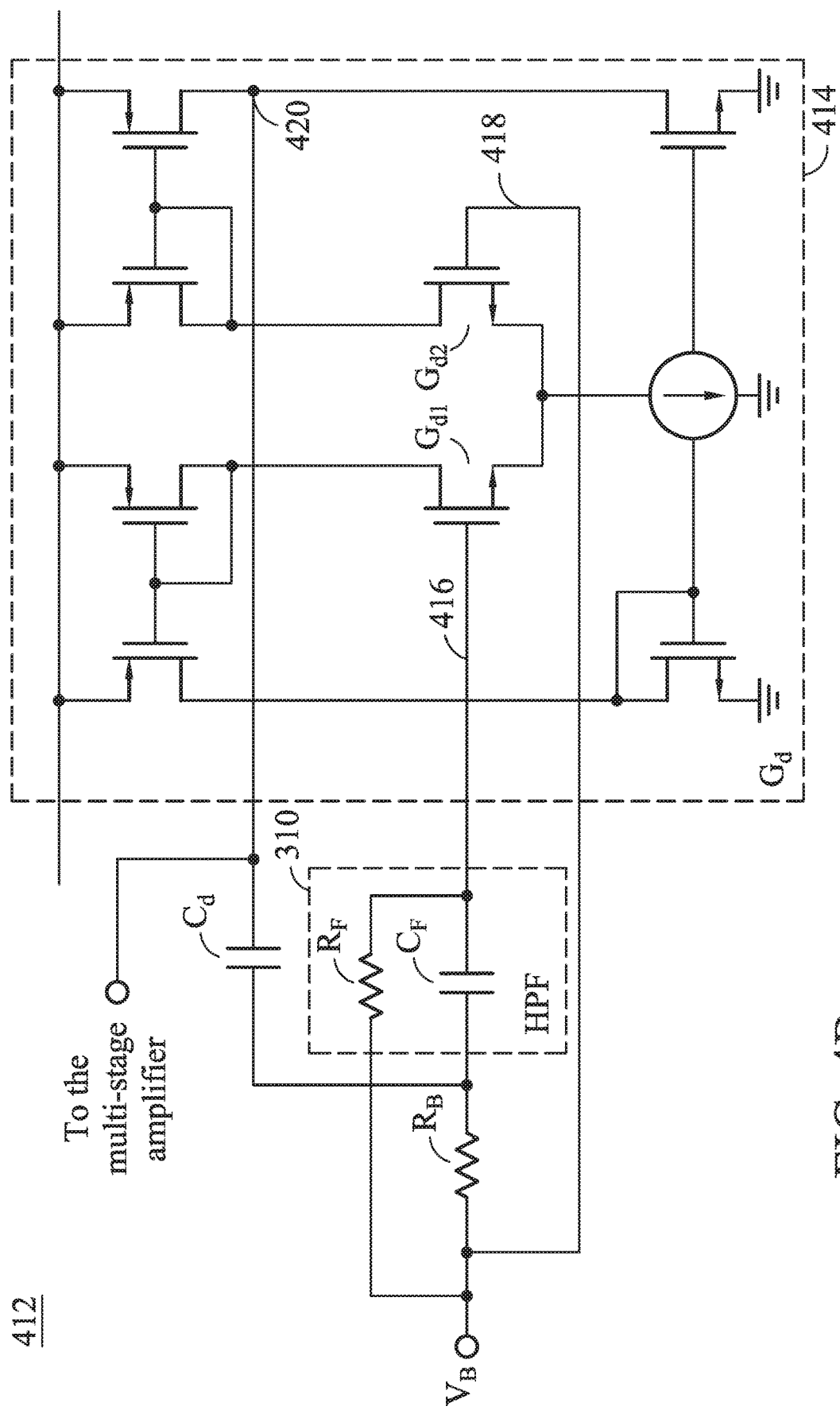
FIG. 4B depicts a second-order damping circuit 412 in accordance with another exemplary embodiment of the present invention, which uses an output rail-to-rail OTA 414 to implement the auxiliary amplifier 108.

FIG. 4B depicts a second-order damping circuit 412 in accordance with another exemplary embodiment of the present invention, which uses an output rail-to-rail OTA 414 to implement the auxiliary amplifier 108 whose transconductance is Gd. The output rail-to-rail OTA 414 has a first differential input terminal 416 which is the input port of the auxiliary amplifier 108, a second differential input terminal 418 coupled to a reference voltage source VB, and an output terminal 420 which is the output port of the auxiliary amplifier 108.

Figure 5:
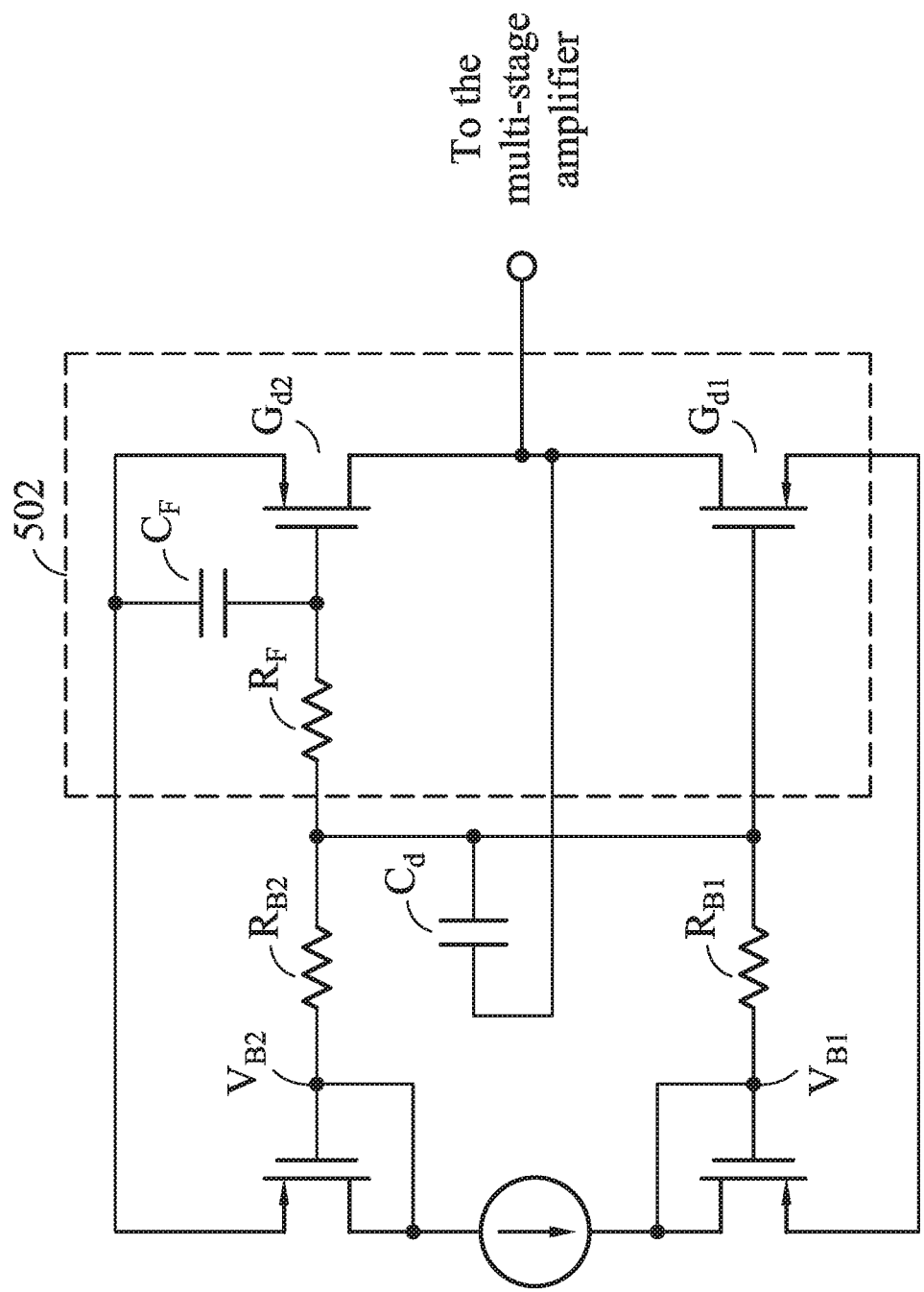
FIG. 5 depicts a second-order damping circuit 500 in accordance with another exemplary embodiment, which uses a current-mode high-pass filter 502 to implement the second-stage high-pass filter 106 and provide the transconductance Gd (contributed by transconductance Gd1 and Gd2)

FIG. 5 depicts a second-order damping circuit 500 in accordance with another exemplary embodiment, which uses a current-mode high-pass filter 502 to implement the second-stage high-pass filter 106 and provide the transconductance Gd (contributed by transconductance Gd1 and Gd2). The first-stage high-pass filtering is implemented by Cd, RB1 and RB2.

Figure 6A:
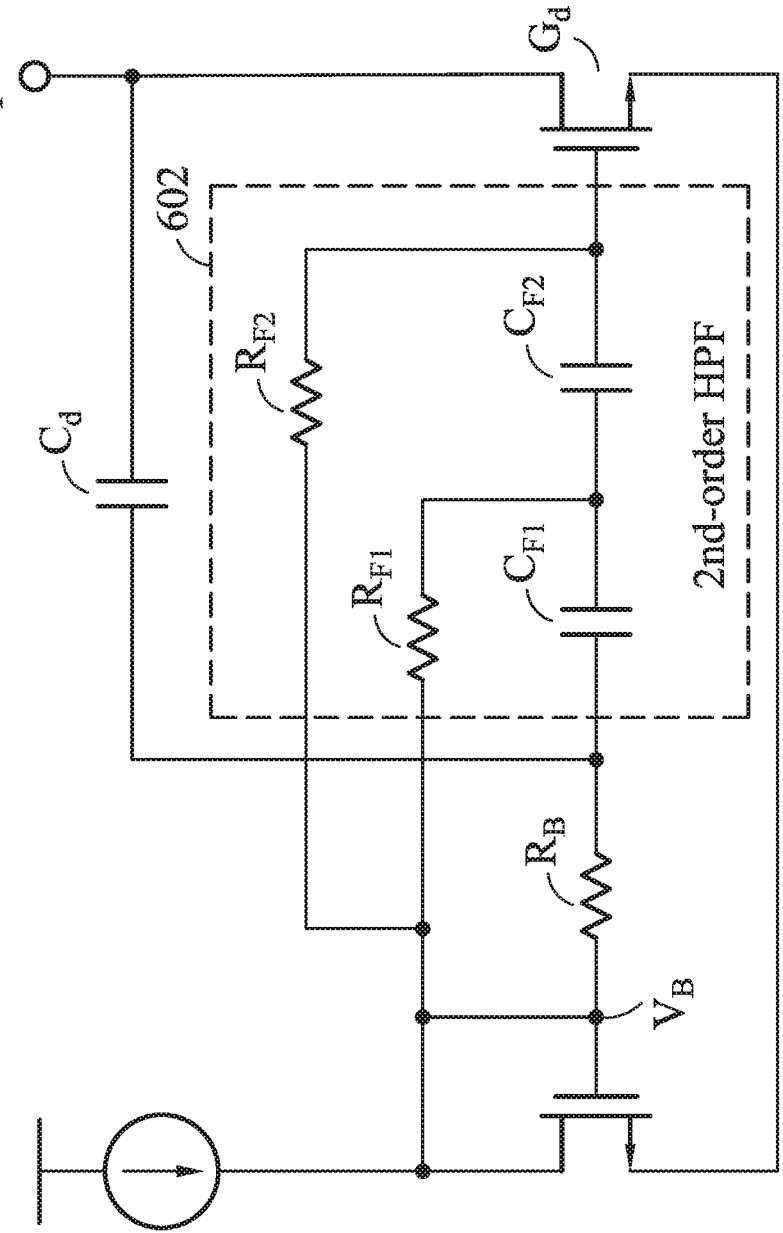
FIG. 6A depicts a third-order damping circuit 604.
Figure 6B:
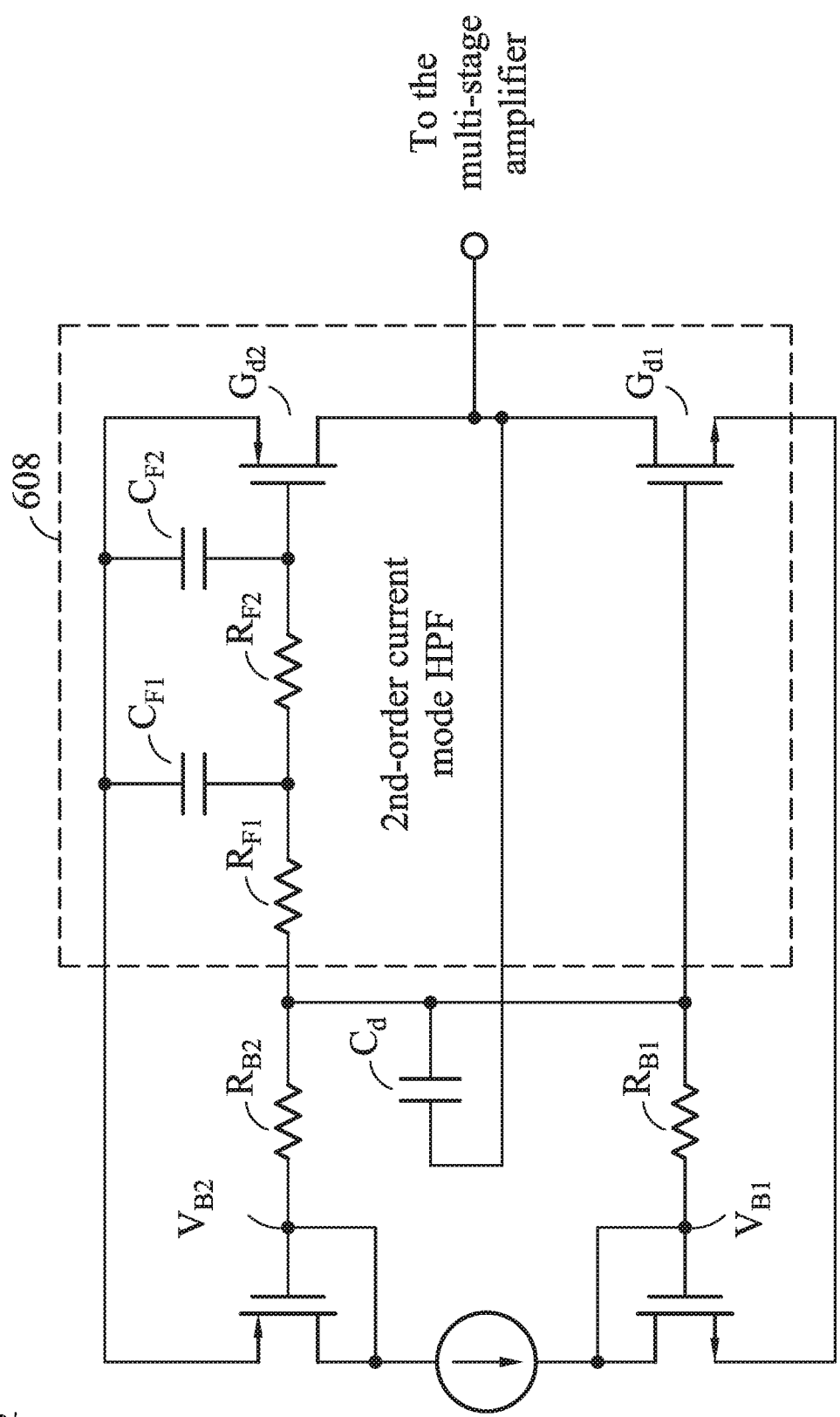
FIG. 6B depicts another third-order damping circuit 606.

The high-order damping circuit 104 of the presented invention is not limited to the second-order design. FIG. 6A uses a second-order high-pass filter 602 to replace the first-order RC high-pass filter 310 of FIG. 3A, and a third-order damping circuit 604 is shown. FIG. 6B depicts another third-order damping circuit 606. The current-mode high-pass filter 502 (a first-order circuit) of FIG. 5 is replaced by a second-order current mode high-pass filter 608.

Figure 7:
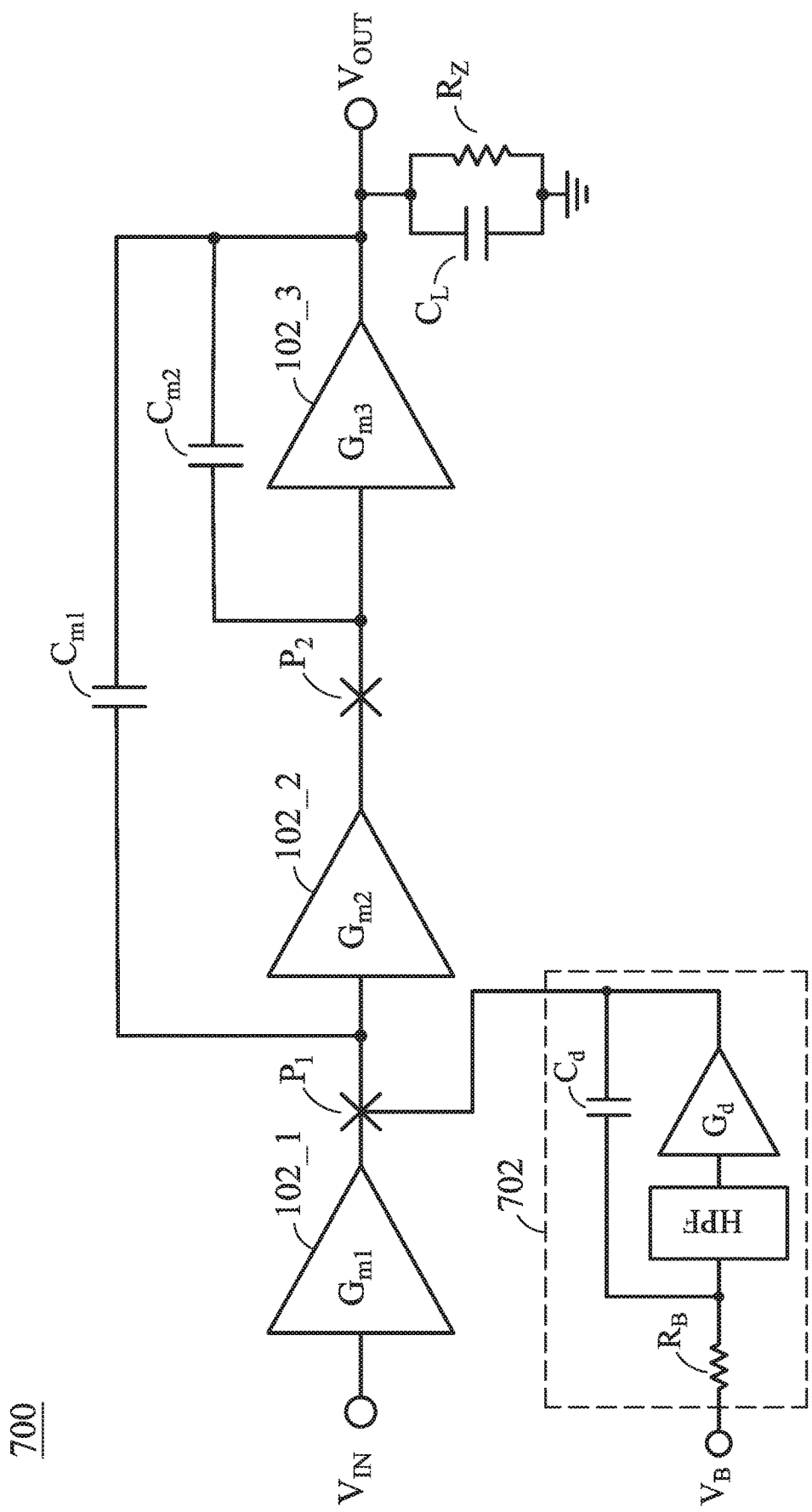
FIG. 7 depicts an amplifier circuit 700 in accordance with another exemplary embodiment of the present invention that has a high-order damping circuit 702 (implemented by any of the aforementioned high-order damping circuits) coupled to the output port P1 of the input-stage amplifier 102_1.

The high-order damping circuit 104 is not limited to be coupled to the output port P2 of the intermediate-stage amplifier 102_2. FIG. 7 depicts an amplifier circuit 700 in accordance with another exemplary embodiment of the present invention that has a high-order damping circuit 702 (implemented by any of the aforementioned high-order damping circuits) coupled to the output port P1 of the input-stage amplifier 102_1.

Figure 8:
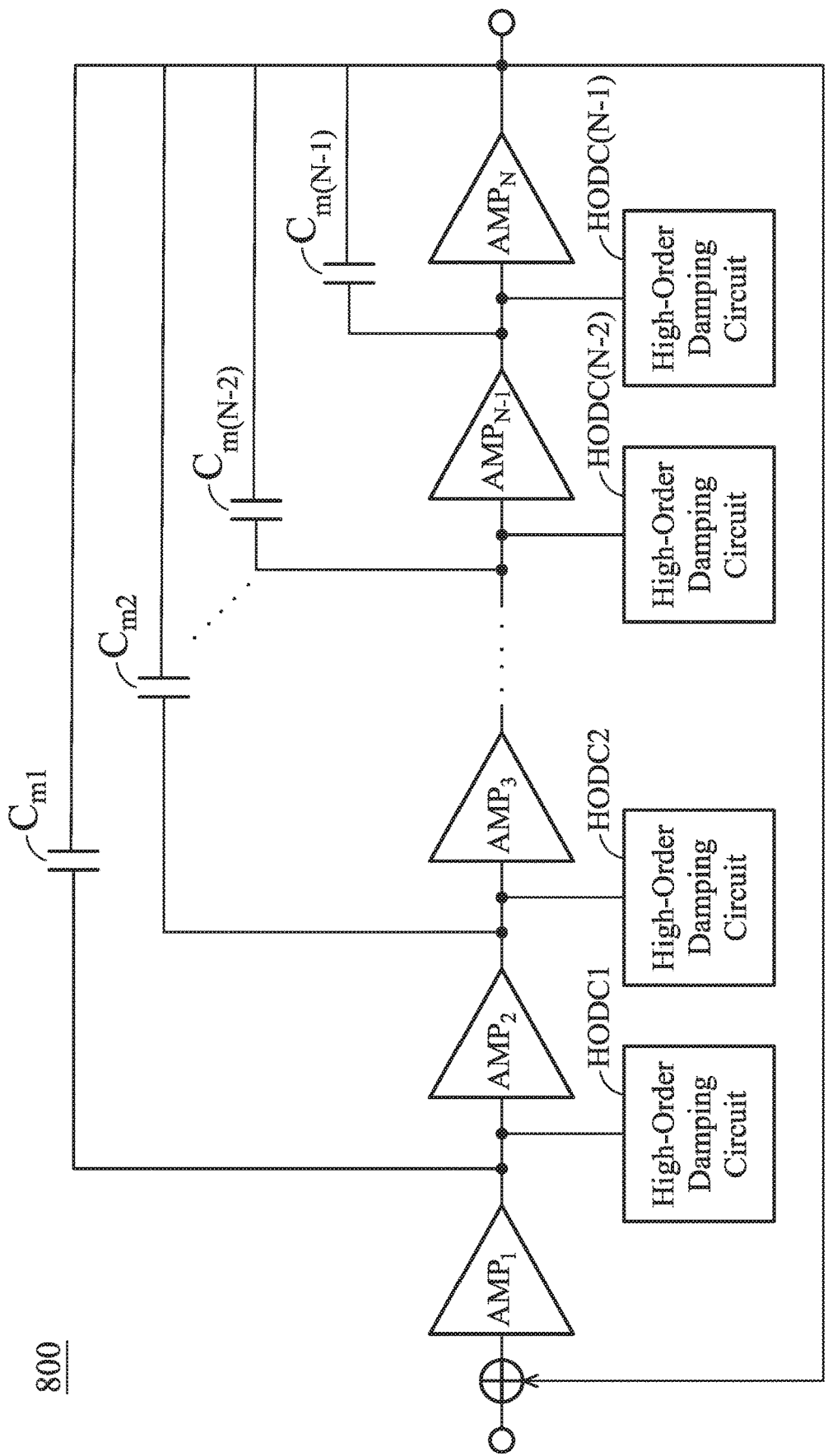
FIG. 8 is a diagram illustrating an amplifier circuit 800 in accordance with another exemplary embodiment of the present invention.

The multi-stage amplifier used in the amplifier circuit 100/700 is a three-stage amplifier. However, the same frequency compensation scheme (shifting the dominant pole to the higher frequency by the high-order damping circuit) can be extended and applied to a multi-stage amplifier having more than three amplifier stages. FIG. 8 is a diagram illustrating an amplifier circuit 800 in accordance with another exemplary embodiment of the present invention. By way of example, but not limitation, the amplifier circuit 800 may be used in an audio application. The amplifier circuit 800 is a multi-stage amplifier circuit including an N-stage amplifier composed of amplifiers AMP1-AMPN, (N−1), high-order damping circuits HODC1-HODC(N−1), and (N−1) compensation capacitors Cm1-Cm(N−1), where N is a positive integer larger than 3 (i.e., N>3). Each of the compensation capacitors Cm1-Cm(N−1) is used for Miller compensation. Regarding the proposed frequency compensation scheme (shifting the dominant pole to the higher frequency by the high-order damping circuit), the compensation capacitors Cm2-Cm(N−1) are optional. In other words, in some embodiments of the present invention, the compensation capacitors Cm2-Cm(N−1) can be omitted, depending upon design considerations. The high-order damping circuits HODC1-HODC(N−1) may be implemented using one of the aforementioned damping circuits, depending upon design considerations. In accordance with the proposed frequency compensation scheme, the dominant pole is controlled by the high-order damping circuits HODC1-HODC(N−1) to avoid in-band degradation. In this way, the amplifier circuit 800 can be stable without in-band gain degradation.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An amplifier circuit, comprising:
    an input-stage amplifier, at least one intermediate-stage amplifier, and an output-stage amplifier, cascaded between an input port and an output port of the amplifier circuit;
    a compensation capacitor, coupled between the output port of the amplifier circuit and an output port of the input-stage amplifier; and
    a first high-order damping circuit, coupled to an output port of the intermediate-stage amplifier,
    wherein the first high-order damping circuit comprises:
    a first-stage high-pass filter, having an input port coupled to the output port of the intermediate-stage amplifier;
    a second-stage high-pass filter, having an input port coupled to an output port of the first-stage high-pass filter; and
    an auxiliary amplifier, having an input port coupled to an output port of the second-stage high-pass filter, and an output port coupled to the input port of the first-stage high-pass filter.

2. The amplifier circuit as claimed in claim 1 wherein:
    the first-stage high-pass filter is a first resistor-capacitor high-pass filter, having a first capacitor coupled between the input port of the first-stage high-pass filter and a connection terminal, and a first resistor coupled between the connection terminal and a reference voltage source; and
    the second-stage high-pass filter is a second resistor-capacitor high-pass filter, having a second capacitor coupled between the connection terminal and the input port of the auxiliary amplifier, and a second resistor coupled between the input port of the auxiliary amplifier and the reference voltage source.

3. The amplifier circuit as claimed in claim 1, wherein the auxiliary amplifier comprises a transistor having a gate and a drain which are the input port and the output port of the auxiliary amplifier, respectively.

4. The amplifier circuit as claimed in claim 1, wherein the auxiliary amplifier is an operational transconductance amplifier having a first differential input terminal which is the input port of the auxiliary amplifier, a second differential input terminal coupled to a reference voltage source, and an output terminal which is the output port of the auxiliary amplifier.

5. The amplifier circuit as claimed in claim 1, wherein the auxiliary amplifier is an output rail-to-rail operational transconductance amplifier having a first differential input terminal which is the input port of the auxiliary amplifier, a second differential input terminal coupled to a reference voltage source, and an output terminal which is the output port of the auxiliary amplifier.

6. The amplifier circuit as claimed in claim 1, wherein the second-stage high-pass filter is implemented by a current-mode high-pass filter.

7. The amplifier circuit as claimed in claim 1, wherein the second-stage high-pass filter is a high-order high-pass filter.

8. The amplifier circuit as claimed in claim 1, further comprising:
    a second high-order damping circuit coupled to an output port of the input-stage amplifier.

9. The amplifier circuit as claimed in claim 8, wherein the second high-order damping circuit comprises:
    a first-stage high-pass filter, having an input port coupled to the output port of the input-stage amplifier;
    a second-stage high-pass filter, having an input port coupled to an output port of the first-stage high-pass filter; and an auxiliary amplifier, having an input port coupled to an output port of the second-stage high-pass filter, and an output port coupled to the input port of the first-stage high-pass filter.

10. A high-order damping circuit compensating for in-band gain degradation of an amplifier circuit that comprises an input-stage amplifier, at least one intermediate-stage amplifier, and an output-stage amplifier cascaded between an input port and an output port of the amplifier circuit, comprising:

a first-stage high-pass filter, having an input port coupled to an output port of the input-stage amplifier or an output port of the intermediate-stage amplifier;

a second-stage high-pass filter, having an input port coupled to an output port of the first-stage high-pass filter; and an auxiliary amplifier, having an input port coupled to an output port of the second-stage high-pass filter, and an output port coupled to the input port of the first-stage high-pass filter.

11. The high-order damping circuit as claimed in claim 10, wherein:

the first-stage high-pass filter is a first resistor-capacitor high-pass filter, having a first capacitor coupled between the input port of the first-stage high-pass filter and a connection terminal, and a first resistor coupled between the connection terminal and a reference voltage source; and the second-stage high-pass filter is a second resistor-capacitor high-pass filter, having a second capacitor coupled between the connection terminal and the input port of the auxiliary amplifier, and a second resistor coupled between the input port of the auxiliary amplifier and the reference voltage source.

12. The high-order damping circuit as claimed in claim 10, wherein the auxiliary amplifier comprises a transistor having a gate and a drain which are the input port and the output port of the auxiliary amplifier, respectively.

13. The high-order damping circuit as claimed in claim 10, wherein the auxiliary amplifier is an operational transconductance amplifier having a first differential input terminal which is the input port of the auxiliary amplifier, a second differential input terminal coupled to a reference voltage source, and an output terminal which is the output port of the auxiliary amplifier.

14. The high-order damping circuit as claimed in claim 10, wherein the auxiliary amplifier is an output rail-to-rail operational transconductance amplifier having a first differential input terminal which is the input port of the auxiliary amplifier, a second differential input terminal coupled to a reference voltage source, and an output terminal which is the output port of the auxiliary amplifier.

15. The high-order damping circuit as claimed in claim 10, wherein the second-stage high-pass filter is implemented by a current-mode high-pass filter.

16. The high-order damping circuit as claimed in claim 10, wherein the second-stage high-pass filter is a high-order high-pass filter.

* * * * *